United States Patent [19]

Baird et al.

[11] Patent Number: 5,317,447

[45] Date of Patent: May 31, 1994

[54] HIGH-POWER, COMPACT, DIODE-PUMPED, TUNABLE LASER

[75] Inventors: Brian Baird, Lake Oswego; Richard DeFreez, Hillsboro, both of Oreg.

[73] Assignee: Electro Scientific Industries, Inc., Portland, Oreg.

[21] Appl. No.: 873,408

[22] Filed: Apr. 24, 1992

[51] Int. Cl.$^5$ .......................... G02F 1/37; H01S 3/094
[52] U.S. Cl. .................................... 359/328; 372/20; 372/22; 372/75; 372/95
[58] Field of Search ...................... 372/20, 21, 22, 75, 372/70, 25, 95; 359/326, 328

[56] References Cited

U.S. PATENT DOCUMENTS

| | | | |
|---|---|---|---|
| 3,982,201 | 9/1976 | Rosenkrantz et al. | 331/94.5 P |
| 4,231,838 | 11/1980 | Gier | 156/600 |
| 4,305,778 | 12/1981 | Gier | 156/623 R |
| 4,653,056 | 3/1987 | Baer et al. | 372/27 |
| 4,688,884 | 8/1987 | Scifres et al. | 350/96.15 |
| 4,710,940 | 12/1987 | Sipes, Jr. | 372/75 |
| 4,762,786 | 8/1987 | Baer | 372/10 |
| 4,763,975 | 8/1988 | Scifres et al. | 350/96.15 |
| 4,811,349 | 3/1989 | Payne et al. | 372/14 |
| 5,022,043 | 6/1991 | Jacobs | 372/95 |
| 5,060,233 | 10/1991 | Harder et al. | 372/75 |
| 5,090,019 | 2/1992 | Scheps | 372/39 |
| 5,105,434 | 4/1992 | Krupke et al. | 372/69 |
| 5,159,605 | 10/1992 | Yagi et al. | 372/75 |

FOREIGN PATENT DOCUMENTS

0346951 12/1989 European Pat. Off. ....... H01S 3/06

OTHER PUBLICATIONS

Dixon, G. J., "Nonlinear Optical Techniques for Frequency Unconversion of Laser Diodes," LEOS '90, IEEE Lasers and Electro-Optics Society Annual Meeting Conference Proceedings, Nov. 4-9, 1990, Boston, Mass. US vol. 2 pp. 138-141.

Walling, J. C., et al., "Tunable Alexandrite," IEEE Journal of Quantum Electronics, vol. QE-21, No. 10, Oct. 1985, pp. 1568-1581.

Zhang, Q., et al., "Electronically Tuned Diode-Laser-Pumped DR:LiSrAlF$_6$ Laser", 1412 Optics Letters 17 (1992) Jan. 1, No. 1, New York, N.Y., US, pp. 43-45.

Hughes, D. W., et al. "Laser Diode Pumped Solid State Lasers," Journal of Physics D: Applied Physics, 25 (1992) Apr. 14, No. 4, Bristol, GB pp. 563-586.

Mermilliod, N., et al. "LaMgAl$_{11}$O$_{19}$:Nd Microchip Laser," 320 Applied Physics Physics Letters 59 (1991) Dec., No. 27, New York, US, pp. 3519-3520.

Plaessmann, et al. "Reducing Pulse Durations In Diode Pumped Q-Switched Solid-State Lasers", IEEE Photonics Technology Letters 3 (1991) Oct. No. 10, New York, US, pp. 886-887.

"Blue Second Harmonic Generation in KTP, LiNbO$_3$ and LiTaO$_3$ Waveguides," *Phillips Journal of Research*, vol. 46, 231-0265 (no month on publication) (1992) by Jongerius et al.

"High Power, Nearly Diffraction-Limited Output from a Semiconductor Laser with an Unstable Resonator," *IEEE Journal of Quantum Electronics*, 2098-2108, vol. 27, No. 9 (Sep. 1991) by Tilton ... DeFreez et al.

"Cr:LiCaAlF$_6$ Laser Pumped by Visible Laser Diodes," *IEEE Journal of Quantum Electronics*, 1968-1970, vol. 27, No. 8, (Aug. 1991) by Scheps.

(List continued on next page.)

*Primary Examiner*—James W. Davie
*Attorney, Agent, or Firm*—Stoel Rives Boley Jones & Grey

[57] ABSTRACT

A high-power semiconductor diode laser or array of semiconductor diode lasers (14) optically end-pumps a compact, tunable, solid-state laser (28) with a pumping beam (74) well-matched to the absorption bandwidth and mode volume (78) of the solid-state laser (28). Tilted birefringent plates (210) positioned within the solid-state resonator cavity (16) are employed to control the spectral bandwidth and wavelength output of the waveguide pumping beam (204). Infrared output (100) generated by such a solid-state laser (28) is coupled into a nonlinear waveguide (200) and converted to visible output (206) through the process of second-harmonic generation.

31 Claims, 4 Drawing Sheets

OTHER PUBLICATIONS

"Diode-Pumped Cr:LiSrAlf$_6$ Laser," *Optics Letters*, 820–822, vol. 16, No. 11 (Aug. 1991) by Scheps et al.

"Miniature Self-Frequency-Doubling CW ND:YAB Laser Pumped by a Diode-Laser," *Optics Communications*, 3, vol. 77, No. 2 (Jun. 15, 1990) by Schutz et al, pp. 221–225.

"Generation of 41 mW of Blue Radiation by Frequency Doubling of a GaAlAs Diode Laser," *Applied Physics Letters*, 2291–2293, vol. 56, No. 23 (Jun. 4, 1990) by Kozlovsky et al.

"Laser Performance of LiSrAlF$_6$:Cr$^{3+}$, " *Journal of Applied Physics*, 1051–1056, vol. 66, No. 3 (Aug. 1, 1989) by Payne et al.

"Diode Laser Pumped Blue-Light Source at 743 nm Using Intracavity Frequency Doubling to a 946 nm Nd YAG Laser," *Applied Physics Letters*, 1625–1627, vol. 54, No. 17 (Apr. 24, 1989) by Risk, Pon, and Lenth.

"LiCaAlF$_6$:Cr$^{3+}$: A Promising New Solid-State Laser Material," *IEEE Journal of Quantum Electronics*, 2243–2252, vol. 24, No. 11, (Nov. 1988) by Payne et al.

"Laser Diode Guide Book," Sony Corporation of America, p. 52–53 (no date).

"Efficient Second Harmonic Generation of a Diode-Laser-Pumped CW ND:YAG Laser Using Monolithic MgO:LiNbO$_3$ External Resonant Cavities," *IEEE Journal of Electronics*, 913–919, vol. 24, No. 6 (Jun. 1988) by Kozlovsky et al.

"Second Harmonic and Sum-Frequency Generation to 4950 and 4589 A° in KTP," *IEEE Journal of Quantum Electronics*, 3–4, vol. QE-24, No. 1 (Jan. 1988) by Kato.

"Room-Temperature, Continous-Wave, 946-nm Nd:YAG Laser Pumped by Laser-Diode Arrays and Intracavity Frequency Doubling to 473 nm", *Optics Letters*, 993–995, vol. 12, No. 12 (Dec. 1987) by Risk and Lenth.

"Optimum Mode Size Criteria for Low Gain Lasers", *Applied Optics*, 1579–1583, vol. 20 (May 2, 1981) by D. G. Hall.

"Efficient LiNdP$_4$O$_{12}$ Lasers Pumped with a Laser Diode," *Applied Optics*, 3882–3882, vol. 18, No. 23 (Dec. 1, 1979) by Kubordera and Otsuka.

"Observations of Self-Focusing of Stripe Geometry Semiconductor Lasers and Development of a Comprehensive Model of Their Operation," *IEEE Journal of Quantum Electronics*, 705–719, vol. QE-13, No. 8 (Aug. 1977) by Kirkby et al.

"Modes of a Laser Resonator Containing Tilted Birefringent Plates," *Journal of the Optical Society of America*, 447–452, vol. 64, No. 4 (Apr. 1974) by Bloom.

"A Theory for Filamentation in Semiconductor Lasers," *Optoelectronics*, 257–310, vol. 4, (1972) by Thompson (no month).

"Cr:LiSrAlF$_6$ Laser Pumped by Visible Laser Diodes," *OSA Proceedings on Advanced Solid-State Lasers*, 291–295, vol. 10 (1991) by Scheps, et al. (no month).

"Nonimaging Optics," *Scientific American*, 76–81, vol. 264, No. 3 (Mar. 1991) by Winston.

"Flashlamp Pumped Cr:LiSrAlF$_6$ Laser," *Applied Physics Letters*, 216–218, vol. 58, No. 3 (Jan. 21, 1991) by Stalder et al.

"Fabrication and Characterization of Planner Ion Gas Exchanged KTiOPO$_4$ Wave Guides for Frequency Doubling," *Applied Physics Letters*, 19–21, vol. 58, No. 1 (Jan. 7, 1991) by Risk.

"Second Harmonic Generation with Focused Broad-Band and High-Order Transverse Mode Lasers," *IEEE Journal of Quantum Electronics*, 113–117, vol. QE-24, No. 1 (Jan. 1988) by Sun and Lue.

"Blue Laser Diodes with DuPont KPT-Waveguides," DuPont Brochure, Reference: APL 56, 1725 (1990) (no month).

Dougherty, T. J., "Photosensitizers: Therapy and Detection of Malignant Tumors," Photochemistry and Photobiology, vol. 45, No. 6, pp. 879–889, (1987) (no month).

Wilson, B. C. and Patterson, M. S., "The Physics of Photodynamic Therapy," Phys. Med. Biol., vol. 31, No. 4, pp. 327–360, (1986) (no month).

DIODE-PUMPED CHROMIUM LASER (DPCL)
OUTPUT POWER VS INPUT DIODE LASER POWER

A-BROAD AREA DIODE
B-URSL

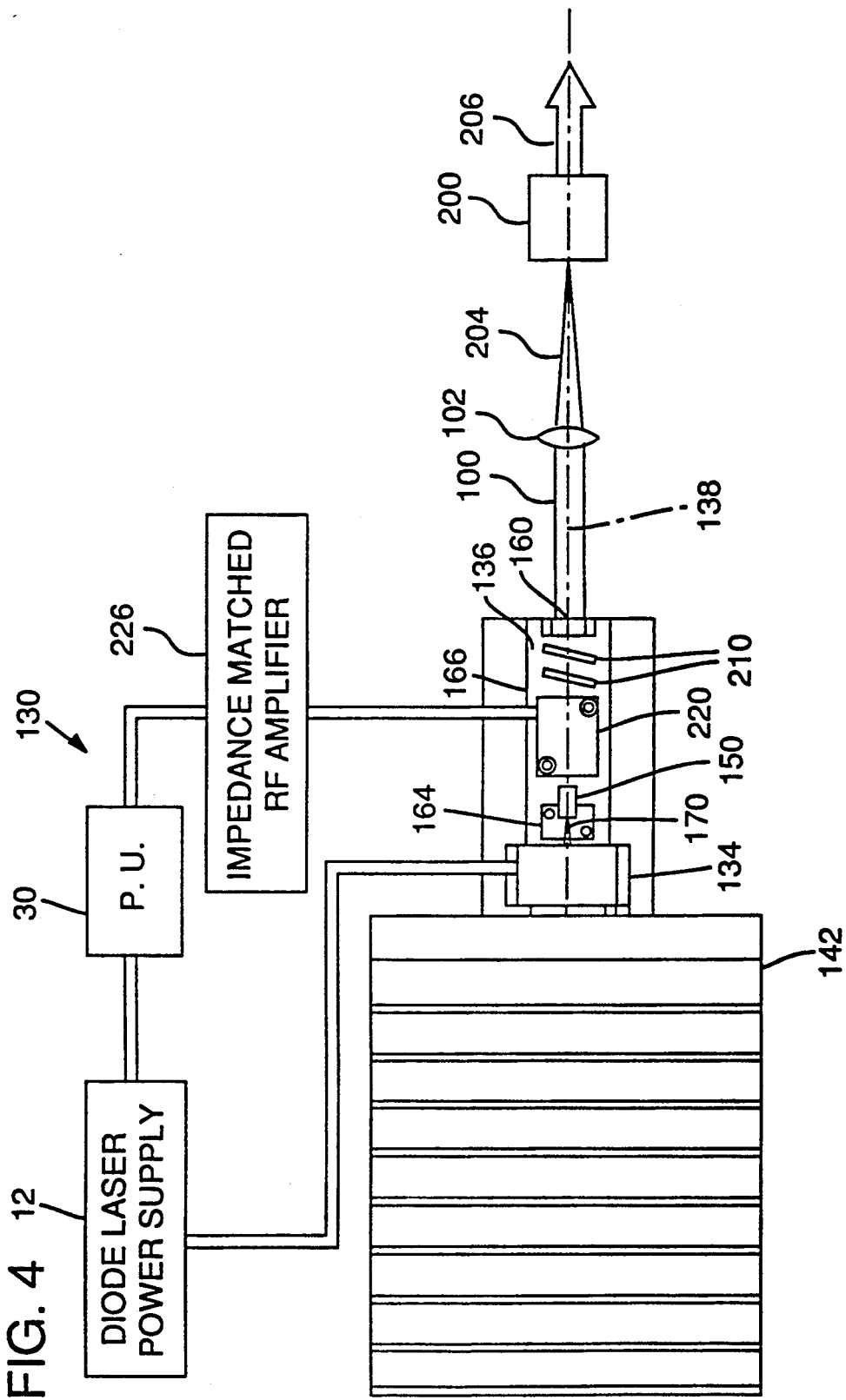

HIGH-POWER, COMPACT, DIODE-PUMPED, TUNABLE LASER

TECHNICAL FIELD

The present invention relates to solid-state lasers optically pumped by diode lasers and, in particular, to a method and an apparatus for generating laser output within a 720-920 nm range and second harmonic generation laser output within a 360-460 nm range for use in medical and electronic processing applications.

BACKGROUND OF THE INVENTION

A variety of methods have been employed for optically pumping solid-state lasers, such as those containing neodymium-doped lithium yttrium fluoride (Nd:YLF) or neodymium-doped yttrium aluminum garnet (Nd:YAG) lasants. A common method is to use an arc lamp or other similar light source to excite a laser rod. The light source and laser rod are positioned within and at different foci of a highly reflective housing of elliptical cross-section. This method typically requires relatively large diameter laser rods to efficiently absorb enough of the pumping light emitted by the light source to allow solid-state laser operation. Another limitation of this pumping method is the relative inefficiency caused by poor overlap of the optical emission spectrum of the pumping light source with the absorption bandwidth of the solid-state lasants. For some industrial operations such as processing electronic materials, compact diode-pumped solid-state lasers offer numerous advantages. For example, large gas lasers or arc-pumped Q-switched YAG lasers that typically require water cooling systems are largely incompatible 17 with clean room conditions often necessary for link processing of dynamic random access memory devices.

There are several different methods for diode-pumping solid-state lasers. In U.S. Pat. No. 3,982,201, Rosenkrantz et al. describe a solid-state laser that is pumped by single diode lasers or arrays of diode lasers to which the solid-state laser rod is end-coupled. Because the output wavelength of the diode laser array is a function of its temperature, the diode lasers are operated in a pulsed mode at a low duty cycle to maintain the array at a sufficiently stable temperature so that its output wavelength remains matched to the absorption bandwidth of the solid-state laser rod. The output power characteristics of this laser system are limited by the relatively inefficient match between the output of the diode lasers and the mode volume of the solid-state laser rod.

In "Efficient LiNdP$_4$O$_{12}$ Lasers Pumped with a Laser Diode," *Applied Optics*, vol. 18, No. 23 (Dec. 1, 1979), Kubodera and Otsuka describe the well-known practice of collecting the output light of a diode laser and focusing its expanded output light using conventional lenses, such as two microscope condenser lenses. This method is particularly well suited for applications where the emitter width and beam divergence of the diode laser are small. However, as the emitter dimensions and beam divergence increase, it becomes increasingly difficult to efficiently collect the output beam with collimating lens or lenses. It also becomes more difficult to focus the expanded beam into the solid-state lasant crystal with sufficient depth of focus to allow efficient overlap of the pump beam throughout the resonator mode volume within the lasant.

In U.S. Pat. No. 4,710,940, Sipes, Jr. describes a Nd:YAG solid-state laser that is end-pumped by a diode laser array or by two diode laser arrays that have been combined by use of polarizing beam-splitting cubes. Sipes, Jr., cites the analysis of D. G. Hall in "Optimum Mode Size Criteria for Low Gain Lasers," *Applied Optics*, 579-1583, vol. 20, (May 1, 1981), to suggest that the "pump profile shape does not matter much as long as all the pump light falls within the resonator mode." Sipes, Jr., notes, however, that Hall's analysis does not account for the divergence properties of Gaussian beams, so Sipes, Jr., suggests that, if required, the cross-section of the pump beam could be modified by use of a cylindrical lens.

In U.S. Pat. No. 4,761,786, Baer describes a Q-switched, solid-state laser that is end-pumped by a diode laser or diode laser array. The output light from the pump source is collected by a collimating lens and directed by a focusing lens to end-pump the laser rod. Baer notes that "other lenses to correct astigmatism may be placed between the collimating lens and focusing lens." Baer also describes an alternate embodiment that employs a remotely positioned diode laser pumping source coupled through an optical fiber, the output of which is focused by a lens into the laser rod.

In U.S. Pat. No. 4,763,975, Scifres et al. describe two optical systems that produce bright light output for a variety of applications, including pumping a solid-state laser such as a Nd:YAG. Scifres et al. describe an optical system that employs a plurality of diode lasers, each of which is coupled into one of a plurality of fiber-optic waveguides. The waveguides are arranged to form a bundle and the light from the diode laser sources is emitted at the output end of the bundle. Optics, such as a lens, may be used to focus the light into a solid-state laser medium. Alternatively, the fiber bundle may be "butt"-coupled to the laser rod. Butt-coupled means end-coupled at a position very close to or in contact with the laser rod.

Scifres et al. describe another optical system that employs a diode laser bar, broad-area laser, or other elongated source to pump a solid-state laser. The diode laser bar light output is coupled into a fiber-optic waveguide having an input end that has been squashed to be elongated and thereby have core dimensions and lateral and transverse numerical apertures that correspond respectively to those of emission dimension and lateral and transverse divergence angles of the diode laser bar. The output light from the fiber-optic waveguide is either focused by a lens into the end of the solid-state laser rod or butt-coupled to the rod. Scifres et al. state that either end of the fiber-optic waveguide can be curved. Although these methods attempt to match the output light from the fiber-optic waveguide to the resonant cavity mode of the solid-state laser, they are limited in efficiency by the numerical aperture of the sources that can be effectively collected and guided by the fiber-optic waveguides.

Certain methods are known for coupling the output of high-power diode lasers into solid-state lasants. High-power diode lasers are necessarily broad-area devices or arrays of narrow-width diode lasers because the potential for catastrophic optical damage to the mirrors dictates that the optical outputs be limited typically to 10 to 20 mW per micron of emission stripe width. Typical high-power diode lasers used to pump solid-state lasants include aluminum gallium arsenide (AlGaAs) diode lasers. Examples of such diode lasers include Model No. SDL-2480-P1 with continuous wave (CW) output power of 3.0 watts (W) and an emission width of 500 $\mu$m; Model No. SDL-2462-P1 with CW output power of 1.0 W and an emission width of 200 $\mu$m; and Model No. SDL-2432-P1 with CW output power of 0.5 W and an emission width of 100 $\mu$m, all of which are manufactured by Spectra Diode Labs, 80 Rose Orchard Way, San Jose, Calif. Use of AlGaAs semiconductor diode lasers to optically pump solid-state lasers has led to development of compact, solid-state lasers.

Broad-area lasers are described by Thompson in "A Theory for Filamentation in Semiconductor Lasers", *Optoelectronics*, 257–310, vol. 4, (1972) and by Kirkby, et al. in "Observations of Self-Focusing in Stripe Geometry Semiconductor Lasers and Development of a Comprehensive Model of Their Operation," *IEEE Journal of Quantum Electronics*, 705–719, vol. QE-13 (1977). Such broad-area lasers (emission width of typically greater than 5 $\mu$m) exhibit a filamentary structure in their optical nearfield patterns. The filament structures arise from a nonlinear interaction between the carriers and the optical field in the active area of the laser. The process of stimulated emission effectively reduces the gain profile within the active area and results in an increase in the refractive index in the portion of the active area contributing most strongly to the optical mode. This region of increased refractive index is bounded by regions of the active area that do not contribute so strongly to the optical mode and are characterized by smaller refractive index values. This lateral variation in refractive index in a local region within the active area of the diode laser can form a local lateral index guide.

When the active area is broader than about 5–10 $\mu$m, as is the case in typical high-power laser diodes used for solid-state laser pumping, several, or in some cases, many such index-guided regions may form. Stimulated emission within each such lateral index-guided region within the active area may occur in the form of a filament that is only partly spatially coherent or is spatially incoherent with respect to neighboring filaments. This filamentation phenomena is, therefore, a fundamental source of lateral spatial incoherence in high-power laser diodes and, consequently, places limits on the optical brightness obtainable from such devices.

Although these methods have with varying degrees of efficiency been used to optically pump solid-state laser mode volumes and been used to produce useful solid-state laser output at a variety of emission wavelengths, improved methods for coupling the optical output from diode lasers into solid-state lasants are highly desirable.

A method for theoretically obtaining high-power, nearly diffraction-limited optical output from a high-power diode laser has recently been described by Tilton, . . . DeFreez, et al., in "High Power, Nearly Diffraction-Limited Output from a Semiconductor Laser with an Unstable Resonator," *IEEE Journal of Quantum Electronics*, 2098–2108, vol. 27, No. 9, (September 1991). The high-power AlGaAs diode laser described therein demonstrates high power (greater than 1 watt from both facets) and nearly diffraction-limited optical output. The reference states that "[f] or many semiconductor laser applications such as solid-state laser end pumping. . . , single-lobed, diffraction limited beams of hundreds of milliwatts are required." Coupling the optical output from such an unstable resonator into a solid-state laser has not heretofore been attempted, but is described in a concurrently filed U.S. patent application Ser. No. 07/873,411 of Baird and DeFreez for Method and Apparatus for Efficient Operation of a Solid-State Laser Optically Pumped by an Unstable Semiconductor Laser, assigned to assignee of the present invention.

Many important laser applications require laser operation at visible or ultraviolet wavelengths. Moreover, a compact source of coherent visible or ultraviolet light output suitable for use in hospital operating rooms and similar medical environments is also highly desirable for use in a wide range of medical treatments, such as photo-activation of therapeutic drugs.

A variety of methods have been described for generating laser output in the 400 nm to 600 nm wavelength range from solid-state lasers and diode lasers by utilizing the nonlinear process of second-harmonic generation (SHG). For example, several methods have been described for producing SHG laser output in the 520–540 nm wavelength range from diode-pumped, solid-state lasers containing a neodymium-doped lasant. Baer, et al. in U.S. Pat. No. 4,653,056 describe one such method in which an AlGaAs diode laser end-pumps a solid-state laser resonator containing a Nd:YAG rod and potassium titanium phosphate (KTP) nonlinear crystal to produce SHG laser output at 532 nm. As described in "Second Harmonic and Sum-Frequency Generation to 4950 and 4589 A° in KTP," *IEEE Journal of Quantum Electronics*, vol. QE-24, No. 1 (January 1988), such bulk KTP crystals are phase-matchable for type-2 second-harmonic generation down to 495 nm. For SHG wavelengths shorter than 495 nm, other nonlinear materials are required.

Kozlovsky, et al. in "Efficient Second Harmonic Generation of a Diode-Laser-Pumped CW Nd:YAG Laser Using Monolithic MgO:LiNbO$_3$ External Resonant Cavities," *IEEE Journal of Quantum Electronics*, vol. 24, No. 6 (June 1988), describe producing about 30 mW of SHG output at 532 nm by using a diode-pumped Nd:YAG, single-mode ring laser operating at 1064 nm to pump an external monolithic cavity of nonlinear magnesium oxide:lithium niobate (MgO:LiNbO$_3$).

Another method of producing SHG laser output at 532 nm is described by Schutz, et al. in "Miniature Self-Frequency-Doubling CW Nd:YAB Laser Pumped by a Diode-Laser," in *Optics Communications*, vol. 77, No. 2, 3 (15 Jun. 1990). Schutz, et al. describe producing a SHG output of about 10 mW at 532 nm by end-pumping a laser resonator containing the self-frequency-doubling lasant neodymium:yttrium aluminum boron (Nd:YAB) with 870 mW emitted by a AlGaAs diode laser array operating at an output wavelength of 807 nm.

Risk and Lenth in "Room-Temperature, Continuous-Wave, 946-nm Nd:YAG Laser Pumped by Laser-Diode Arrays and Intracavity Frequency Doubling to 473 nm," *Optics Letters*, Vol. 12, No. 12 (December 1987), describe a method to pump a 1 mm length rod of Nd:YAG with two 0.25 W diode laser arrays whose output are combined using a polarizing beamsplitter cube arrangement. The method employs a 5 mm long crystal of lithium iodate (LiIO$_3$) cut for Type I phased-matched frequency doubling of 946 nm output at room temperature in the solid-state laser resonator cavity and produces approximately 100 $\mu$W of SHG blue light at 473 nm. Risk, Pon, and Lenth in "Diode Laser Pumped Blue-Light Source at 743 nm Using Intracavity Frequency Doubling of a 946 nm Nd:YAG Laser," *Applied Physics Letters*, vol. 54, No. 17 (24 Apr. 1989), describe further work on a similar method employing a single 0.5 W laser diode to end-pump a solid-state laser resonator containing a 1 mm long Nd:YAG rod and a 3.7 mm long KNbO$_3$ nonlinear crystal to produce 3.1 mW of blue output at 473 nm.

Methods have also been described in which the laser output from diode lasers are directly frequency doubled. Kozlovsky, et al. describes such a method in "Generation of 41 mW of Blue Radiation by Frequency Doubling of a GaAlAs Diode Laser," *Applied Physics Letters*, vol. 56, No. 23, (4 Jun. 1990). They employ a monolithic ring resonator of KNbO$_3$ to convert 105 mW of incident diode laser power at 856 nm to 41 mW of blue 428 nm output power. This method, however, requires use of a diode laser operating in a single longitudinal mode. High-power, gain-guided diode lasers typically do not operate in a single-longitudinal mode and single spatial mode and therefore are not likely to be useful for this method in efforts to achieve higher SHG output powers. In addition, the room-temperature wavelength limit for noncritical phase-matching in KNbO$_3$ of about 860 nm is likely to prevent SHG wavelengths significantly shorter than the wavelengths they describe from being produced using KNbO$_3$ and similar methods.

In "Blue Second Harmonic Generation in KTP, LiNbO$_3$ and LiTaO$_3$ Waveguides," *Phillips Journal of Research*, vol. 46, 231-265 (1992), Jongerius, et al. describe conversion of an infrared pump beam into a blue beam by SHG through coupling the pump beam into channel waveguides that have been diffused into the surface of KTP, LiNbO$_3$, or lithium tantalate (LiTaO$_3$) substrates. They describe achieving 6 mW of 460 nm output power from a periodically segmented domain-inverted KTP waveguide by pumping the waveguide with 920 nm output from a Ti:Sapphire solid-state laser.

As those skilled in the art will appreciate, AlGaAs diode lasers typically operate within the wavelength range 770 nm to 840 nm. The efficiency of high-power AlGaAs lasers is typically poorer at shorter wavelengths in comparison to higher wavelengths due to active region heating effects. Therefore, conversion of the output power from an AlGaAs diode laser utilizing SHG is likely to be limited to wavelengths greater than 385 nm, unless methods to produce SHG conversion at wavelengths lower than those conventionally demonstrated can be found.

Accordingly, it would be desirable to find a method to produce a compact, diode-pumped solid-state laser which has useful laser output in a more extensive range, such as the 720-920 nm, that can be converted using the nonlinear process of SHG to visible or ultraviolet laser output in the 360-460 nm range.

New chromium-doped, solid-state laser materials such as chromium:lithium calcium aluminum fluoride (Cr:LiCAlF) and chromium:lithium strontium aluminum fluoride (Cr:LiSAlF) have been shown to provide optical output in the 720-920 nm range. These solid-state laser materials are described by S. A. Payne, et al., in "LiCaAlF$_6$:Cr$^{3+}$: A Promising New Solid-State Laser Material," *IEEE Journal of Quantum Electronics*, 2243-2252, vol. 24, No. 11, (November 1988); S. A. Payne, et al., in "Laser Performance of LiSrAlF$_6$:Cr$^{3+}$," in *Journal of Applied Physics*, 1051-1055, vol. 66, No. 3; and by S. A. Payne et al. in U.S. Pat. No. 4,811,349.

Such inhomogenously broadened materials have been optically pumped by aluminum gallium indium phosphide (AlGaInP) diode lasers as described by Scheps, et al., in "Cr:LiCaAlF$_6$ Laser Pumped by Visible Laser Diodes," *IEEE Journal of Quantum Electronics*, 1968-1970, vol. 27, No. 8 (August 1991) and by Scheps, et al., in "Diode-Pumped Cr:LiSrAlF$_6$ Laser," *Optics Letters*, 820-822, vol. 16, No. 11 (Jun. 1, 1991). However, the relatively low stimulated emission cross-section-fluorescence lifetime product of these materials consequently requires relatively large pump powers to obtain laser operation threshold by pumping with such a broad area, high-power diode laser. This requirement results from the relatively large pumping beam radius inherent from the lateral spatial incoherence typical of such devices. The optical output of such a broad-area, high-power diode laser coupled via conventional methods into such an inhomogenously broadened solid-state lasant material is insufficient to generate optical output of usable power from such a solid-state lasant.

Thus, improved methods for coupling the optical output of high-power diode lasers, especially those having improved lateral spatial coherence, into the mode volumes of a solid-state lasant such as Cr:LiCAlF or Cr:LiSAF are highly desirable.

SUMMARY OF THE INVENTION

An object of the present invention is, therefore, to provide a compact, tunable, solid-state laser that is optically end-pumped by a diode laser or by an array of diode lasers. The method of optical pumping is chosen to provide a pumping beam with excellent spatial overlap with respect to the resonator mode volume. Both the pump beam radius within the lasant and the resonator mode radius are tailored to be small to produce TEM$_{00}$ mode operation at low diode laser output powers.

In one embodiment, the very bright output from an unstable resonator semiconductor diode laser (URSL) is collected and focused using conventional lenses into a solid-state laser resonator mode volume.

Another object of the invention is to provide a method for coupling infrared laser output within the 720-920 nm range generated by such a diode-pumped, tunable, solid-state laser into a nonlinear waveguide in order to convert the infrared output beam to a visible or near ultraviolet output beam within the 360-460 nm range by utilizing the nonlinear process of second-harmonic generation (SHG).

A further object of this invention is to produce a longitudinally URSL-pumped solid-state laser in which the laser rod is of a Cr:LiCAF or Cr:LiSAF type and in which the solid-state laser reaches threshold laser operation at low pumping power output.

In another embodiment, the output of a high-power diode laser or array of diode lasers is collected using a nonimaging concentrator fabricated from a crystalline, high refractive index material that is close-coupled to the mode volume of the solid-state lasant. This method is described in concurrently filed U.S. patent application Ser. No. 7/873,449 of Baird, DeFreez, and Sun for Method and Apparatus for Generating and Employing a High Density of Excited Ions in a Lasant, which is assigned to assignee of the present application. The high-power diode laser in the preferred embodiment described by Baird et al. is of a type that is typically gain-guided in the lateral plane of the device and index-guided in the transverse plane. Accordingly, the diode laser is typically spatially incoherent in the lateral plane, thus limiting its optical brightness. The surface of the lasant that is close-coupled to the output aperture of the nonimaging concentrator has a dichroic coating, which is transparent at the pumping wavelength and highly reflective at the solid-state laser wavelength, and forms one mirror of the solid-state laser resonator cavity. This surface may be fabricated with a radius of curvature. A second mirror, which is partly reflecting and partly transmitting at the laser wavelength, and which may be fabricated with a radius of curvature, serves to complete the resonator cavity and to couple laser light out of the resonator cavity.

Yet another object of the invention is to employ the laser output power generated by such methods to process electronic materials, such as dynamic random access memories (DRAMs), and to photo-activate drugs sensitive at these wavelengths for use in therapeutic medical applications.

In another embodiment, a Q-switch is inserted into the solid-state laser resonator cavity to produce a laser output of short (<100 ns), Q-switched pulses.

In another embodiment, the continuous wave (CW) laser output power from the diode-pumped tunable solid state laser is coupled using conventional lenses into a nonlinear waveguide to convert the infrared laser output beam from the solid-state laser into a visible laser output beam by use of the nonlinear process of second-harmonic generation. A further embodiment couples the Q-switched output from the solid-state laser into the nonlinear waveguide to produce a laser output of visible or near ultra-violet, short-pulsewidth, Q-switched pulses.

Additional objects and advantages of the present invention will be apparent from the following detailed description of the preferred embodiments thereof, which proceeds with reference to the accompanying drawings.

BRIEF DESCRIPTION OF THE DRAWINGS

FIG. 4 is a partly schematic plan view of a laser system incorporating a high-power diode laser, a nonimaging concentrator, and a solid-state lasant in accordance with an alternate embodiment of the present invention.

DETAILED DESCRIPTION OF PREFERRED EMBODIMENTS

Figure 1:
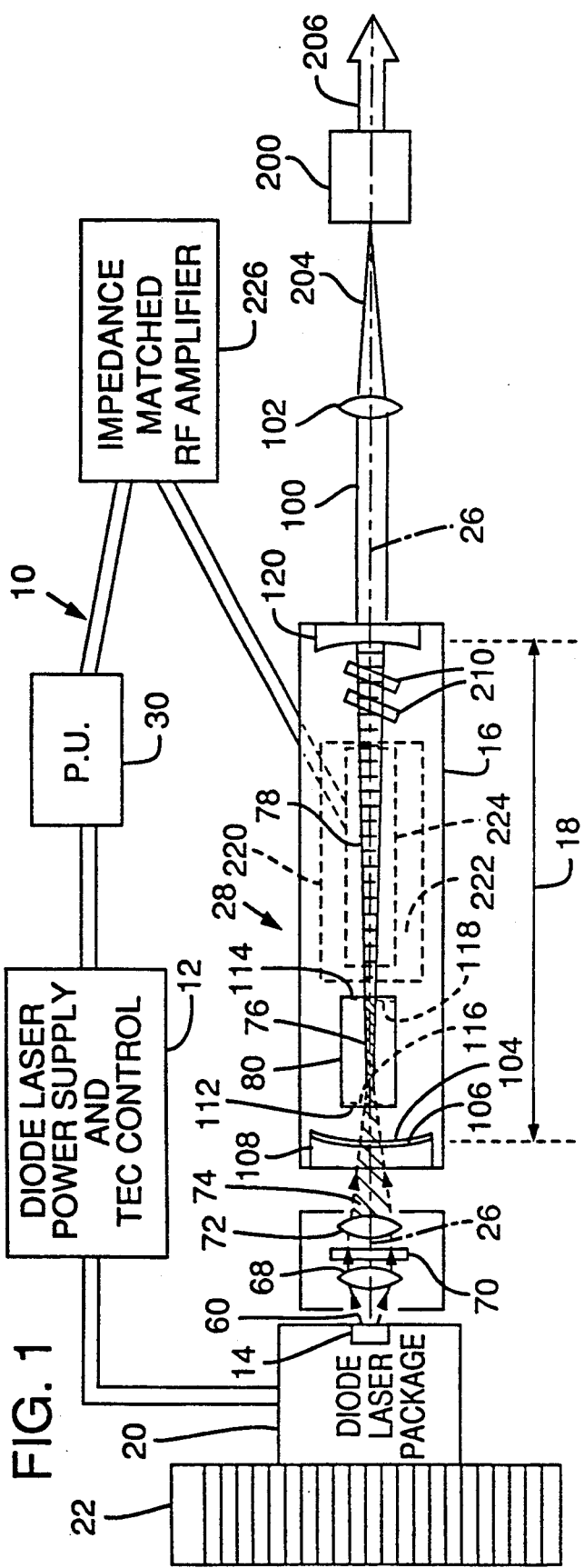
FIG. 1 is a partly schematic plan view of a laser system incorporating an unstable resonator semiconductor laser, a lens system, and a solid-state lasant in accordance with a preferred embodiment of the present invention.
Figure 2B:
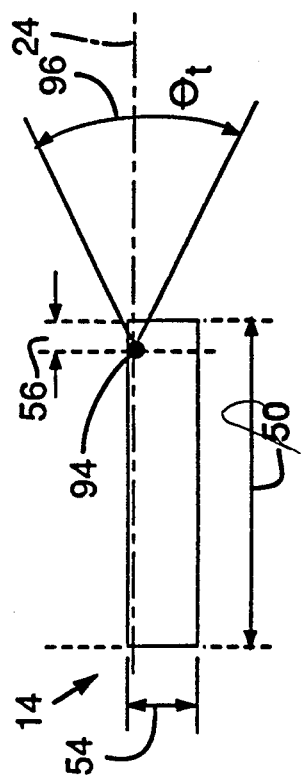
FIGS. 2A and 2B are respective enlarged plan and side elevation illustrations of an URSL incorporated in the laser system of FIG. 1.
Figure 2A:
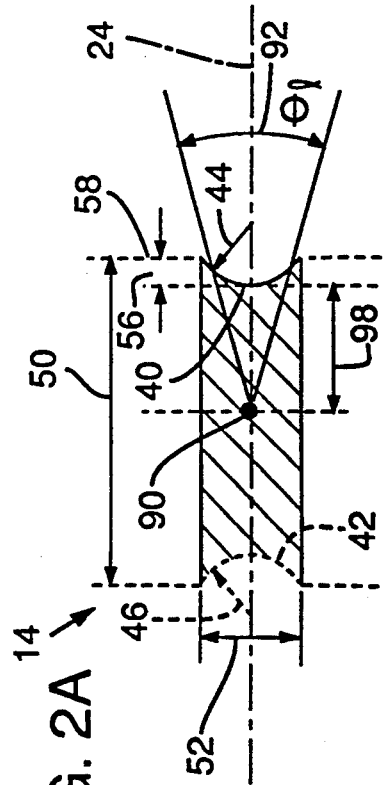

With reference to FIGS. 1, 2A, and 2B, laser system 10 preferably includes a power supply 12 for supplying electrical current to a high-power, unstable resonator semiconductor laser (URSL) 14 with an optical output of greater than 250 mW to pump a solid-state laser resonator cavity 16 having a cavity length 18 of about 15 mm. High-power URSL 14 forms part of a diode laser package 20 that is connected to a heat sink 22. High-power URSL 14 is positioned so that its optic axis 24 (FIGS. 2A and 2B)is substantially coaxial to an optic axis 26 extending through resonator cavity 16 of a solid-state laser 28. A processing unit (PU) 30 determines the power level and other signal levels supplied by power supply 12 to high-power URSL 14.

High-power URSL 14 can be fabricated by focused ion beam micromachining, as described in Tilton, . . . DeFreez, et al., of one or both mirrors 40 and 42 and to provide mirror surfaces with respective radii of curvature 44 and 46 such that the combination of mirror curvatures 44 and 46 imparts a greater than unity lateral magnification to an optical field propagating within high-power URSL 14. For example, high-power URSL 14 may be a broad-area, high-power AlGaInP semiconductor diode laser that typically emits at wavelengths in the range 610 nm to 690 nm. Such a high-power URSL 14 may have a cavity length 50 of 500 $\mu$m, an active area width 52 of 200 $\mu$m, an active area thickness 54 of 0.005-2.0 $\mu$m, and a mirror 42 with a spherical radius of curvature 46 of infinity. Mirror 40 of 300 $\mu$m of such a high-power URSL 14 may be micromachined to have a spherical radius of curvature 44 of 2200 $\mu$m with maximum sag depth 56 of 5.1 $\mu$m along URSL optical axis 24 with respect to the unmachined mirror plane 58. Such a high-power URSL 14 may have a resonator magnification of 2.5.

Unlike conventional high-power diode lasers and arrays of diode lasers used for pumping solid-state lasants, high-power URSL 14 exhibits lateral spatial coherence as well as transverse spatial coherence. This improvement in spatial coherence results in high-power URSL 14 generating a high-power optical output 60 that can be efficiently collected by a lens system that typically includes a collimating lens 68 and a cylindrical lens 70. Optical output 60 is subsequently focused by an objective lens 72 to form an optical pumping beam 74 that has its radius and depth of focus selected to be well-matched to the radius and length of a lasant mode volume 76. The lasant mode volume 76 constitutes the portion of mode or beam volume 78 of resonator cavity 12 that is contained within solid-state lasant 80. Skilled persons will appreciate that in FIG. 1, mode or beam volume 78 is shown greatly enlarged for ease of visualization and does not represent a true path through the other elements in FIG. 1.

Analyses suggest that adjustments to the radii of curvature 44 and 46 of the respective mirrors 40 and 42, in combination with adjustments to the cavity length 50, can modify lateral divergence angle 92 originating from virtual point source 90 in the lateral plane to make angle 92 substantially equal to transverse divergence angle 96 originating from real point source 94 in the transverse plane of high-power URSL 14. A highly advantageous feature of using a high-power URSL 14 is that it allows use of the very small cavity mode and pump mode radii (less than 50 $\mu$m) that contributes to the reduction of the threshold pumping power required for operation of solid-state laser 28.

This arrangement effectively reduces the power of optical output 60 required from high-power URSL 14 to obtain threshold operation of solid-state laser 28. Furthermore, optical pumping beam 74 is preferably selected with lasant mode volume 76 to produce $TEM_{00}$ mode laser operation, a useful property which allows optical output beam 100 (preferably greater than 100 mW) from resonator cavity 16 to be readily focused by a lens assembly 102 employing conventional optical methods.

Figure 3:
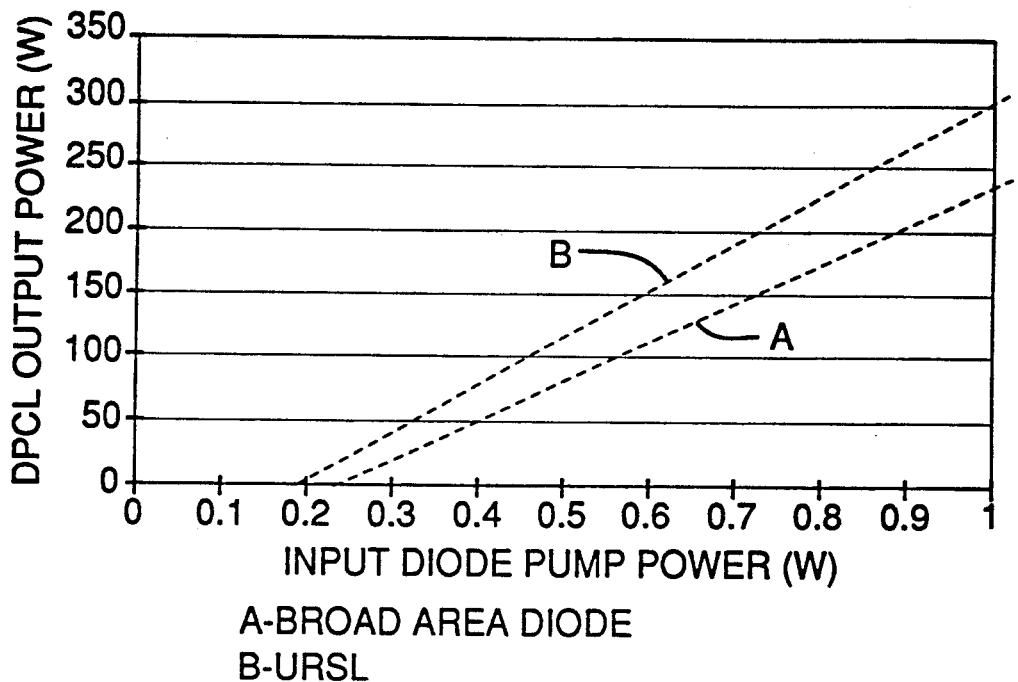
FIG. 3 is a graphical representation of analytical data illustrating the differences in diode output power required for threshold operation of a Cr:LiCAF laser when pumped by, respectively, a broad-area diode laser and an URSL, each having equal emission widths and cavity lengths.

FIG. 3 is a graphical representation of exemplary analytical data depicting output power vs. diode-pumping power applied to a Cr:LiCAF laser. The data illustrate the threshold operation of a Cr:LiCAF laser achieved with pumping power supplied by a broad-area diode laser (slope A) and by an URSL (slope B), each having equal emission widths and cavity lengths. Slope A demonstrates that an URSL of the present invention provides not only a reduction in threshold, but also provides a better slope efficiency. A person skilled in the art will appreciate these differences are generally true regardless of changes made to the numerous variables used to calculate the data illustrated in FIG. 3.

Alternatively a high-power, gain-guided AlGaInP diode laser could be employed in place of URSL 14. As those skilled in the art will appreciate, and as shown in FIG. 3, the reduced lateral spatial coherence of this type of device will typically result in a larger threshold pumping power required for laser operation of the solid-state laser.

The optical brightness of a high-power gain-guided diode laser or array of diode lasers is typically limited by lateral spatial incoherence of the optical output arising from filamentation. Filamentation of the optical output arises from the reduction of the gain profile within the active area of the diode laser because of stimulated emission of the optical mode. The resulting increase in the refractive index in the portion of the active area contributing most strongly to the optical mode results in an increase in the refractive index bounded by the smaller refractive index values in the surrounding portions of the active region that are not contributing as strongly to the optical mode. This variation in the index profile within the active area can form an index-guided region. When the active area is broader than about 5–10 $\mu$m, which is typical in the case of high-power laser diodes, several, and in some cases many, such index-guided regions may form. Stimulated emission within each such index-guided region of the active area may be in the form of a filament that is spatially incoherent with respect to neighboring filaments. This filamentation phenomenon, therefore, is a fundamental source of lateral spatial incoherence in high-power diode lasers, and consequently, contributes to limiting the optical brightness of such devices.

With reference to FIG. 1, resonant cavity 16 of solid-state laser 28 preferably includes a solid-state lasant 80 that comprises a chromium-doped crystal, such as Cr:LiSrAlF$_6$ or Cr:LiCaAlF, positioned along optic axis 26. The preferred dopant level for Cr:LiSrAlF$_6$ or Cr:LiCaAlF$_6$ lasants employed in the present invention is greater than 1.0% atomic. Skilled persons will appreciate that lasant 80 may be any chromium-doped fluoride composition of Cr$^{3+}$:XYZF$_6$ composition wherein X is selected from Li$^+$, Na$^+$, K$^+$, and Rb$^+$, Y is selected from Ca$^{2+}$, Sr$^{2+}$, Ba$^{2+}$, Cd$^{2+}$, and Mg$^{2+}$, and Z is selected from Al$^{3+}$, Ga$^{3+}$, and Sc$^{3+}$.

The length of solid-state lasant 80 is typically selected such that the mathematical product of the lasant length and the absorption coefficient of the lasant at the preselected diode laser pump wavelength is greater than or equal to one. The pumping beam radius within the lasant is selected to substantially overlap the resonator cavity mode radius.

A dichroic coating 104 is applied to a preferably curved surface 106 of a rear resonator mirror 108. Dichroic coating 104 is highly transmissive at the preselected high-power URSL pump wavelength such as 650 nm and highly reflective at a preselected lasant emission wavelength such as 780 nm. Lasant surfaces 112 and 114 may be coated for high transmission at the lasant emission wavelength, and may have respective wedge angles 116 and 118 which may be Brewster's angle defined by the lasant emission wavelength and polarization. An output coupling mirror 120 that is partly transmissive at the lasant emission wavelength and which may have a radius of curvature, forms the opposite end of resonator cavity 16. In an alternate embodiment, resonator mirror 108 is eliminated and dichroic coating 104 is applied to lasant surface 112 so that it forms one reflective surface of resonator cavity 16. When used as one of the reflective surfaces of resonator cavity 16, lasant surface 112 is fabricated with an appropriate radius of curvature.

The radii of curvature are chosen in conjunction with cavity length 18 and the geometry of lasant 80 to provide a resonator mode beam waist or radius waist that permits low threshold laser operation. In the preferred embodiment, resonator mirror 108 has a radius of curvature of 100 mm, and output coupling mirror 120 has a radius of curvature 20 mm. Lasant 80 has a length of about 5 mm and has a rectangular cross section of 4 mm × 5 mm. A $TEM_{00}$ mode radius waist of less than 40 $\mu$m is located within lasant mode volume 76 near lasant surface 112. Optical pumping beam 74 is focused to have a beam radius well-matched to the $TEM_{00}$ mode radius throughout lasant mode volume 76.

Figure 5:
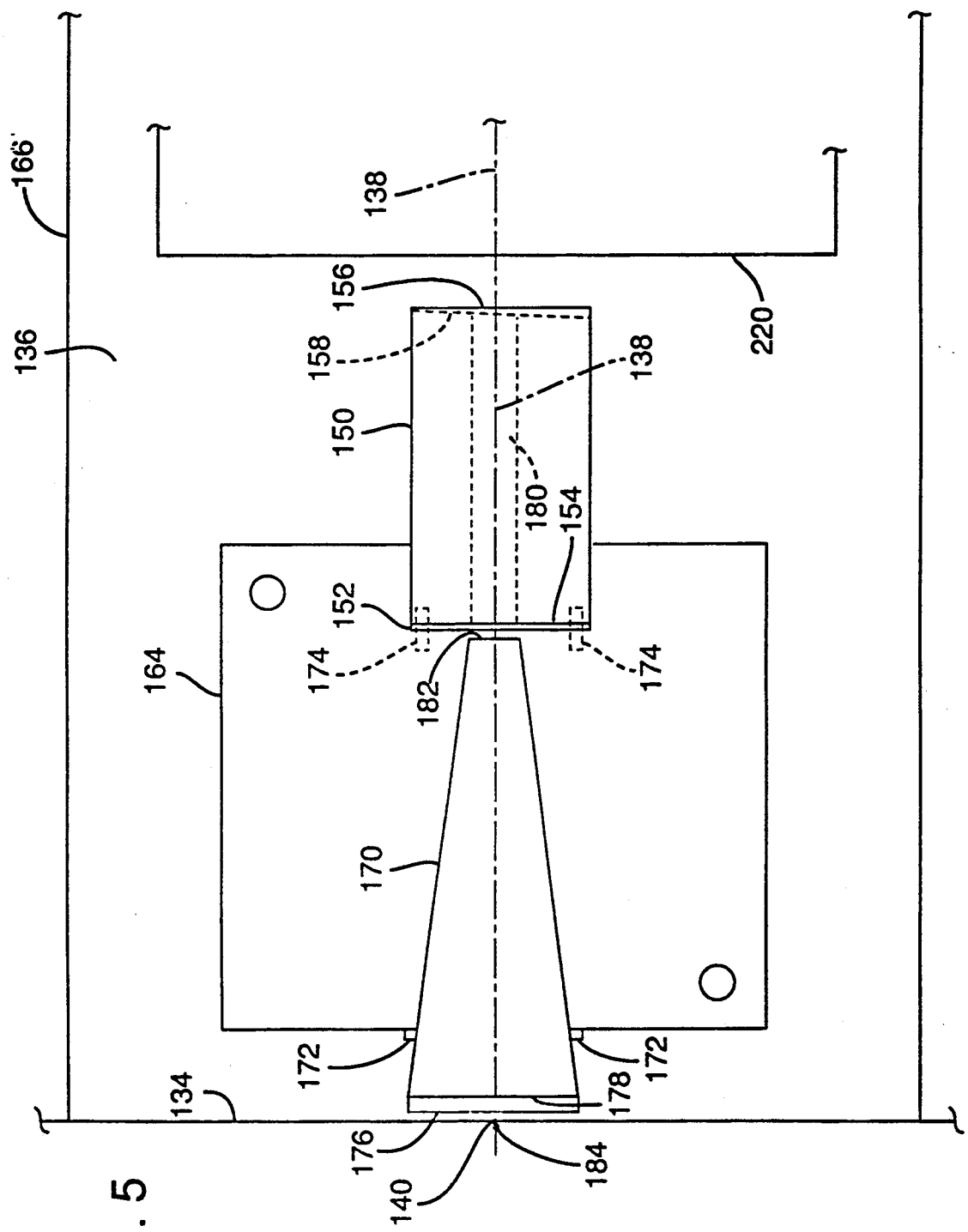
FIG. 5 is an enlarged, fragmentary, cross-sectional plan view of a portion of the laser system of FIG. 4 showing a nonimaging concentrator coupled to a lasant.

FIG. 4 is a schematic diagram of an alternate embodiment of laser system 130 of the present invention. FIG. 5 is an enlarged, elevated, fragmentary, cross-sectional view of a portion of the laser system of FIG. 4 showing a nonimaging concentrator coupled to a lasant. Some elements of laser system 130 are labeled with reference numerals that correspond to similar elements in laser system 10 of FIG. 1. Although these elements may not be identical in dimension or composition, their functional descriptions will be omitted in the interest of brevity.

With reference to FIGS. 4 and 5, laser system 130 preferably includes a power supply 12 for supplying electrical current to a high-power, AlGaInP diode laser 134 with typical optical output power of greater than 250 mW to pump solid-state laser resonator cavity 136. High-power diode laser 134 is positioned along an optic axis 138 and emits a pumping beam 140 that travels substantially collinearly with and proximal to optic axis 138. Pumping beam 140 emitted by high-power diode laser 134 is typically astigmatic and has a noncircular radiation pattern whenever diode laser 134 is of the gain-guided type. High-power, gain-guided diode lasers are easier to manufacture, more widely available, less expensive, and typically available with higher optical output power than high-power, index-guided diode lasers.

The output wavelength of high-power diode laser 134 may be adjusted by temperature tuning, i.e. controlling the voltage supplied to the thermoelectric cooler package 142 to which high-power diode laser 134 is mounted. Temperature tuning is well known in the art and is described in "Laser Diode Guide Book," Sony Corporation of America, p. 52. The output wavelength of high-power diode laser 134 is typically adjusted to a preselected wavelength that is within the absorption bandwidth of solid-state lasant 150.

A dichroic coating 152 is applied to rear surface 154 to form one end of resonator cavity 136. Output surface 156 of solid-state lasant 150 may have a wedge angle 158, which may be the Brewster's angle defined by the emission wavelength and polarization, to minimize retroreflections of the pumping beam directed towards high-power diode laser 134. Further, output surface 154 may be coated to be highly transmissive at the lasant emission wavelength. A concave output coupling mirror 160, partly transmissive at the lasant emission wavelength, forms the opposite end of resonator cavity 136.

A coupling stage 164 is mounted into resonator housing 166 and is adapted to receive a nonimaging concentrator 170 and solid-state lasant 150 to facilitate coupling and alignment of nonimaging concentrator 170 to high-power diode laser 134 and solid-state lasant 150. Coupling stage 164 preferably provides for nonimaging concentrator 170 to be closely end-coupled to solid-state lasant 150 with only a small air gap of about 10 $\mu$m between them. Coupling stage 164 is machined to allow minor orientation adjustments of solid-state lasant 150 so that its $\pi$ and $\rho$ crystallographic axes are properly aligned with respect to optic axis 138. An epoxy or solder is also preferably applied at coupling stage points 172 and fill holes 174 to secure nonimaging concentrator 170 and lasant 30 to coupling stage 164.

Nonimaging concentrator 170 preferably is of cylindrical shape with linear taper, which is "best fit" to an ideal compound parabolic concentrator, and is fabricated from sapphire or other high refractive index, crystalline dielectric material. Persons skilled in the art will appreciate that such crystalline material, such as sapphire, is unlike amorphous materials, such as those used for fiber-optic waveguides, and cannot readily be squashed to form elongated shapes such as described by Scifres et al. Nonimaging concentrator 170 also preferably includes a microcylindrical lens 176 ground onto its input aperture 178 to reduce the transverse divergence angle, which is typically larger than the lateral divergence angle, of pumping beam 140 to allow efficient coupling of it from high-power diode laser 134 into lasant mode volume 180 (the portion of the resonator mode volume contained within solid-state lasant 150) in resonator cavity 136.

Figure 6:
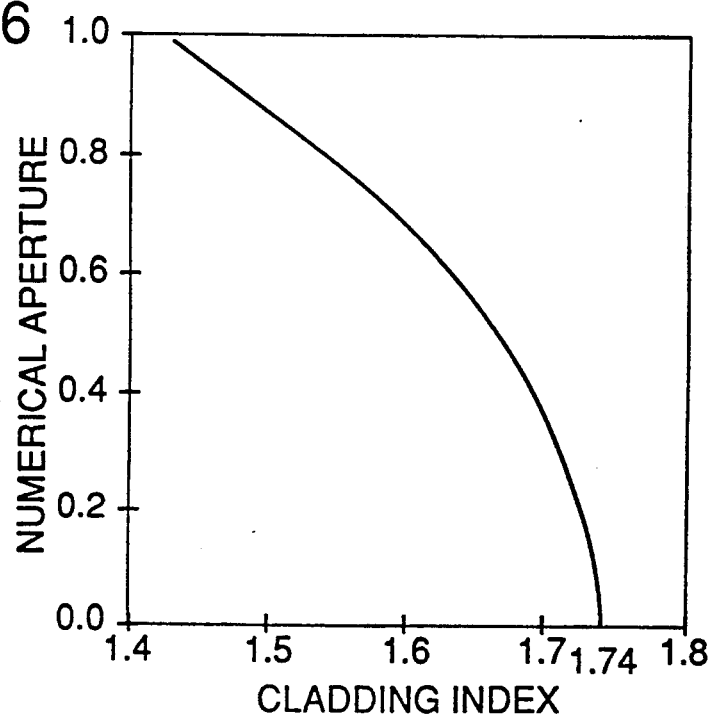
FIG. 6 is a graph showing the numerical aperture of a nonimaging concentrator of refractive index 1.74 of as a function of cladding index.

FIG. 6 is a graph showing the numerical aperture of a nonimaging concentrator 170 of refractive index 1.74 as a function of the cladding index. FIG. 6 is not corrected for tilt angle of the concentrator taper, which typically is very small. FIG. 6 demonstrates that a nonimaging concentrator 170 with refractive index 1.74 in air collects all rays that are not reflected at the interface. Those skilled in the art will recognize that antireflection coatings can be applied to microcylindrical lens 176 and the output aperture 182 to greatly reduce reflections at these interfaces. This coupling embodiment is a significant improvement over use of single-mode or multimode fiber-optic waveguides, such as described by Scifres et al. in U.S. Pat. No. 4,673,975. Moreover, the relatively low refractive index step between the transparent core and cladding material characteristic of such fiber-optic waveguides results in a significant numerical aperture limit for Scifres et al.'s devices.

Preferably, nonimaging concentrator 170 has an input aperture 178 that is larger than the width of the active area of emission 184 of high-power diode laser 134 and of sufficient diameter to intercept essentially all radiation emitted from the high-power diode laser 134. In addition, the nonimaging concentrator 170 has an output aperture 182 that is less than the diameter of lasant mode volume 180. The nonimaging coupling of pumping beam 140 from high-power diode laser 134 into lasant mode volume 180 results in an efficient overlap of pumping beam 140 with the lasant mode volume 180, thus minimizing losses which would otherwise occur through divergence of the pumping beam outside lasant mode volume 180.

In an alternate embodiment, microcylindrical lens 176 is an independent lens, fabricated from sapphire or similar index material and positioned between nonimaging concentrator 170 and diode laser 134. The nonimaging coupling of pumping beam 140 from high-power diode laser 134 into lasant mode volume 180 results in an effective overlap of pumping beam 140 with lasant mode volume 180, thus minimizing losses which would otherwise occur through divergence of the pumping beam outside lasant mode volume 180.

Although the following description proceeds with reference to FIGS. 1 and 4, elements common to both laser systems 10 and 130, but having different reference numerals will be identified by the reference numerals appearing in FIG. 1. With reference to FIGS. 1 and 4, a nonlinear waveguide 200 is placed external to solid-state laser resonator cavity 16. Nonlinear waveguide 200 is selected from a group including periodically segmented domain-inverted KTP waveguide, periodically segmented LiNbO$_3$, and segmented LiTaO$_3$. The solid-state laser optical output 100, which is linearly polarized with polarization direction parallel to the crystallographic c-axis of lasant 80, is collected and focused using conventional lens assembly 102 to form a waveguide pumping beam 204. Nonlinear waveguide 200 is mechanically oriented in a mount (not shown) such that the waveguide pumping beam 204 polarization direction is in correct orientation to be confined within waveguide 200. A periodically segmented domain-inverted KTP waveguide 200 is preferred to convert the infrared waveguide pumping beam 204 emitting in the wavelength range 720 to 920 nm to a visible or near ultraviolet output beam 206 operating in the wavelength range 360 to 460 nm by utilizing the nonlinear process of second-harmonic generation.

The efficiency with which the optical power of the waveguide pumping beam 204 is converted into optical power of the visible output beam 206 can be optimized by selection of the radius and spectral bandwidth of the waveguide pumping beam 204 to best match a selected segmentation period, waveguide length, and waveguide width as described by Jongerius, et al. For the purpose of controlling the spectral bandwidth and wavelength output of the waveguide pumping beam 204, tilted birefringent plates or other tuning elements 210, may be introduced into resonator cavity 16, according to the analyses well-known to the art of Bloom in "Modes of a Laser Resonator Containing Tilted Birefringent Plates" *Journal of the Optical Society of America*, vol. 64, No. 4, 447–452. Plates 210 may be fabricated from quartz or similar birefringent materials. The plates 210 are tilted at Brewster's angle, and each plate 210 has its optic axis aligned perpendicular to the plane defined by the p polarization of the Brewster surfaces.

For the purposes of controlling the radius of waveguide pumping beam 204, the effective focal length of lens assembly 102 can be selected to provide focused spot sizes of less than 10 μm. For example, solid-state laser beam 100 may have a $TEM_{00}$ radius of 57 μm at the output coupler mirror 120 and have a $TEM_{00}$ radius of 72 μm at lens assembly 102, which may be a single or double convex lens, and which then focuses solid-state laser output beam 100 to form waveguide pumping beam 204. Waveguide pumping beam 204 is focused to a 5 μm spot size in nonlinear waveguide 200. Other methods known to the art may be employed to control the spectral bandwidth and waveguide pumping beam radius without departing from the scope of the present invention.

With reference to FIGS. 1, 4, and 5, resonator cavity 16 also preferably includes a modulator 220, shown in phantom, interposed along optic axis 26 between lasant 80 and output coupling mirror 120. Skilled persons will appreciate that the solid-state resonator cavity and high-power URSL dimensions previously set forth describe a specific continuous wave embodiment of laser system 10 not actually shown in FIG. 1. It is noted that inclusion of modulator 220 within solid-state resonator cavity 16 would require adjustment of most of the dimensions to compensate for the elongated solid-state resonatory cavity 16 depicted in FIG. 1.

Modulator 220 is preferably a Q-switch that employs an acousto-optic medium 222, preferably quartz or SF-57 glass or other medium having an acceptable figure of merit such as fused silica or $TeO_2$, that is bonded to an acoustic wave transducer 224. Acoustic wave transducer 224 receives an RF signal from an impedance-matched RF power amplifier 226 that is responsive to signals from processing unit 30.

When an RF signal is present, transducer 224 generates an acoustic wave that propagates through medium 222 transverse to the optic axis 26 in resonator cavity 16. The acoustic wave functions as a diffraction grating that substantially increases the optical losses in resonator cavity 16 to effectively prevent lasing and consequently allow energy to be stored in the lasant 80. Whenever the RF signal to transducer 224 is interrupted, the grating is removed and the optical losses in resonator cavity 16 are diminished. While employing this method, a laser system of the present invention can generate short optical pulses having a duration of typically less than 50 ns with high peak power.

High peak power pulses generated by the method described in the above embodiments can be coupled into nonlinear waveguide 200. Using the nonlinear process of second harmonic generation, pulsed infrared waveguide pumping can be converted to an output beam 206 of visible or near-ultraviolet high peak power pulses.

Persons skilled in the art will appreciate that crystal length and dopant level are selected concurrently with the pump beam radius, resonant mode radius, and output coupler transmission to generate advantageous values for the pumping beam power required at laser threshold. Skilled persons will also appreciate that as good quality higher dopant level laser crystals become available, the length of the lasant can be reduced in order to utilize smaller pump beam and resonant mode radii to even further reduce the pumping beam output power required at threshold.

It will be obvious to those having skill in the art that various changes may be made in the details of the above-described embodiments of the present invention without departing from the underlying principles thereof. For example, high-power URSL 14 can be composed of other light-emitting semiconductor material such as InGaAsP or ZnSe. The scope of the present invention should be determined, therefore, only by the following claims.

We claim:

1. A method for generating usable laser optical output substantially in a 360–460 nm range, comprising:

generating with a high-power diode laser an optical pumping output at a pumping emission wavelength;

coupling said optical pumping output into a solid-state lasant positioned within a solid-state resonator cavity, said solid-state lasant having an absorption bandwidth well-matched to said pumping emission wavelength and a solid-state laser optical output in a 720–920 nm wavelength range; and coupling said solid-state laser optical output into a nonlinear waveguide for converting said solid-state laser optical output from said 720–920 nm wavelength range to usable laser optical output in said 360–460 nm wavelength range.

2. The method of claim 1 in which said high-power diode laser comprises an unstable resonator semiconductor laser.

3. The method of claim 1 in which said high-power diode laser comprises AlGaInP that emits at about 610–690 nm and preferably at 650 nm.

4. The method of claim 1 further comprising a tuning element for selecting the wavelength of said solid-state laser optical output.

5. The method of claim 1 in which said solid-state lasant comprises a chromium-doped fluoride crystal of $Cr^{3+}:XYZF_6$ composition wherein X is selected from $Li^+$, $Na^+$, $K^+$, and $Rb^+$, Y is selected from $Ca^{2+}$, $Sr^{2+}$, $Ba^{2+}$, $Cd^{2+}$, and $Mg^{2+}$, and Z is selected from $Al^{3+}$, $Ga^{3+}$, and $Sc^{3+}$.

6. The method of claim 1 further comprising a nonimaging concentrator positioned between said high-power diode laser and said solid-state lasant, said nonimaging concentrator comprising a high refractive index, crystalline, dielectric material to efficiently couple said optical pumping output of said high-power diode laser into said solid-state lasant.

7. The method of claim 1 in which said nonlinear waveguide is selected from periodically segmented domain-inverted KTP, periodically segmented $LiNbO_3$, and segmented $LiTaO_3$.

8. The method of claim 1 further comprising: employing a Q-switch and generating usuable laser optical output pulses of substantially high peak power.

9. The method of claim 1 further comprising directing said usable laser output toward medical agents to photoactivate them.

10. The method of claim 1 further comprising directing said usable laser output toward electronic materials to process them.

11. The method of claim 2 in which the solid-state lasant comprises a chromium-doped fluoride crystal of $Cr^{3+}:XYZF_6$ composition wherein X is selected from $Li^+$, $Na^+$, $K^+$, and $Rb^+$, Y is selected from $Ca^{2+}$, $Sr^{2+}$, $Ba^{2+}$, $Cd^{2+}$, and $Mg^{2+}$, and Z is selected from $Al^{3+}$, $Ga^{3+}$, and $Sc^{3+}$.

12. The method of claim 5 further comprising a nonimaging concentrator positioned between said high-power diode laser and said solid-state lasant.

13. The method of claim 3 in which said nonlinear waveguide is selected from periodically segmented domain-inverted KTP, periodically segmented LiNbO₃, and segmented LiTaO₃.

14. A laser system for generating usable laser system optical output in a 360–460 nm wavelength range, comprising:
   a high-power diode laser to generate optical pumping output at a pumping emission wavelength;
   a solid-state lasant positioned within a solid-state resonator cavity, said solid-state lasant having an absorption bandwidth that is well-matched to said pumping emission wavelength and a solid-state laser optical output in a 720–920 nm wavelength range; and
   a nonlinear waveguide for converting said solid-state laser optical output from said 720–920 nm range to usable laser system optical output in said 360–460 nm wavelength range.

15. The laser system of claim 14 in which said high-power diode laser comprises an unstable resonator semiconductor laser.

16. The laser system of claim 14 in which said high-power diode laser comprises AlGaInP that emits at about 610–690 nm and preferably at 650 nm.

17. The laser system of claim 14 further comprising a tuning element for selecting the wavelength of said laser system optical output.

18. The laser system of claim 14 in which said solid-state lasant comprises a chromium-doped fluoride crystal of $Cr^{3+}$:$XYZF_6$ composition wherein X is selected from $Li^+$, $Na^+$, $K^+$, and $Rb^+$, Y is selected from $Ca^{2+}$, $Sr^{2+}$, $Ba^{2+}$, $Ba^{2+}$, $Cd^{2+}$, and $Mg^{2+}$, and Z is selected from $Al^{3+}$, $Ga^{3+}$, and $Sc^{3+}$.

19. The laser system of claim 14 further comprising a nonimaging concentrator positioned between said high-power diode laser and said solid-state lasant, said nonimaging concentrator comprising a high refractive index, crystalline, dielectric material to efficiently couple said optical pumping output of said high-power diode laser into said solid-state lasant.

20. The laser system of claim 14 in which said nonlinear waveguide is selected from periodically segmented domain-inverted KTP, periodically segmented LiNbO₃, and segmented LiTaO₃.

21. The laser system of claim 14 further comprising a Q-switch positioned within said resonator cavity for generating usable laser system optical output pulses of high peak power.

22. The laser system of claim 14 in which said laser system is substantially compact.

23. The laser system of claim 14 in which said usuable laser system optical output is greater than 50 mW.

24. The laser system of claim 15 in which the solid-state lasant comprises a chromium-doped fluoride crystal of $Cr^{3+}$:$XYZF_6$ composition wherein X is selected from $Li^+$, $Na^+$, $K^+$, and $Rb^+$, Y is selected from $Ca^{2+}$, $Sr^{2+}$, $Ba^{2+}$, $Cd^{2+}$ and $Mg^{2+}$, and Z is selected from $Al^{3+}$, $Ga^{3+}$, and $Sc^{3+}$.

25. The laser system of claim 18 further comprising a nonimaging concentrator positioned between said high-power diode laser and said solid-state lasant.

26. A method for processing a target sensitive to usable laser optical output in a 360–460 nm range, comprising:
   generating with a high-power diode laser an optical pumping output at a pumping emission wavelength;
   coupling said optical pumping output into a solid-state lasant positioned within a solid-state resonator cavity, said solid-state lasant having an absorption bandwidth well-matched to said pumping emission wavelength and a solid-state laser optical output in a 720–920 nm wavelength range;
   coupling said solid-state laser optical output into a nonlinear waveguide for converting said solid-state laser optical output from said 720–920 nm wavelength range to said usable laser optical output in said 360–460 nm wavelength range; and
   directing said usable laser optical output toward said target to process it.

27. The method of claim 26 in which said method for processing comprises photoactivating and said target comprises a medical agent.

28. The method of claim 26 in which said target comprises an electronic material.

29. The method of claim 26 further comprising:
   providing a Q-switch; and
   operating said Q-switch to generate usable laser optical output pulses of substantially high peak power.

30. The method of claim 27 further comprising:
   providing a Q-switch; and
   operating said Q-switch to generate usable laser optical output pulses of substantially high peak power.

31. The method of claim 28 further comprising:
   providing a Q-switch; and
   operating said Q-switch to generate usable laser optical output pulses of substantially high peak power.

* * * * *